(12) United States Patent
Wen et al.

(10) Patent No.: US 8,735,738 B2
(45) Date of Patent: May 27, 2014

(54) PRINTED CIRCUIT BOARD GROUNDING STRUCTURE FOR USE WITH COMMUNICATION APPARATUS

(75) Inventors: Hsiang-Sheng Wen, Pingzhen (TW); Ching-Feng Hsieh, Taipei (TW)

(73) Assignee: Askey Computer Corp. (TW)

( * ) Notice: Subject to any disclaimer, the term of this patent is extended or adjusted under 35 U.S.C. 154(b) by 702 days.

(21) Appl. No.: 12/984,655

(22) Filed: Jan. 5, 2011

(65) Prior Publication Data

US 2012/0145439 A1   Jun. 14, 2012

(30) Foreign Application Priority Data

Dec. 10, 2010  (TW) ............................. 99143260 A

(51) Int. Cl.
| | |
|---|---|
| *H05K 1/09* | (2006.01) |
| *H05K 5/04* | (2006.01) |
| *H05K 9/00* | (2006.01) |
| *H05K 7/04* | (2006.01) |

(52) U.S. Cl.
USPC ........................... 174/261; 174/257; 361/818

(58) Field of Classification Search
CPC ..... H05K 1/0243; H05K 5/04; H05K 5/0047; H05K 9/0039; H05K 9/0037
USPC ................... 174/257, 261; 361/818
See application file for complete search history.

(56) References Cited

U.S. PATENT DOCUMENTS

| | | | | | |
|---|---|---|---|---|---|
| 5,335,147 | A | * | 8/1994 | Weber ............................ | 361/818 |
| 5,398,169 | A | * | 3/1995 | Gorenz et al. ................ | 361/818 |
| 5,483,413 | A | * | 1/1996 | Babb ............................. | 361/220 |
| 5,748,455 | A | * | 5/1998 | Phillips et al. ................ | 361/818 |
| 6,016,083 | A | * | 1/2000 | Satoh .............................. | 333/12 |
| 6,031,732 | A | * | 2/2000 | Koike et al. .................... | 361/816 |
| 6,137,693 | A | * | 10/2000 | Schwiebert et al. .......... | 361/803 |
| 6,377,475 | B1 | * | 4/2002 | Reis ............................... | 361/818 |
| 6,462,436 | B1 | * | 10/2002 | Kay et al. ........................ | 307/91 |
| 6,490,438 | B1 | * | 12/2002 | Wu .............................. | 455/90.1 |
| 6,614,663 | B1 | * | 9/2003 | Yokota et al. .................. | 361/780 |
| 6,653,563 | B2 | * | 11/2003 | Bohr ............................. | 174/520 |
| 6,744,640 | B2 | * | 6/2004 | Reis et al. ..................... | 361/818 |
| 7,295,083 | B2 | * | 11/2007 | Kimata et al. .................. | 333/12 |
| 7,626,832 | B2 | * | 12/2009 | Muramatsu et al. .......... | 361/818 |
| 7,999,195 | B2 | * | 8/2011 | Huang et al. .................. | 174/382 |
| 2002/0080593 | A1 | * | 6/2002 | Tsuge et al. ................... | 361/818 |

(Continued)

FOREIGN PATENT DOCUMENTS

| | | | |
|---|---|---|---|
| JP | 2008072009 A | * | 3/2008 |
| JP | 2010056348 A | * | 3/2010 |
| TW | 200841812 | | 10/2008 |

*Primary Examiner* — Jeremy C Norris
*Assistant Examiner* — Nathan Milakovich
(74) *Attorney, Agent, or Firm* — Schmeiser, Olsen & Watts, LLP

(57) ABSTRACT

A printed circuit board grounding structure for use with a communication apparatus is configured for use with a printed circuit board to contact a grounded casing and thereby form a grounded circuit capable of electromagnetic wave shielding. The printed circuit board ground structure includes a copper conductive layer and a plurality of solder contacts. The copper conductive layer is circumferentially disposed along the periphery of the printed circuit board. The solder contacts are disposed on the copper conductive layer and used for electrically contacting with the casing. The printed circuit board grounding structure prevents deterioration of electromagnetic wave shielding despite oxidation of the copper conductive layer. The circumferentially-disposed copper conductive layer blocks electromagnetic wave generated from inside the printed circuit board, prevents leakage of the electromagnetic wave, and ultimately prevents the electromagnetic wave from interfering with other electronic apparatuses.

5 Claims, 4 Drawing Sheets

(56) References Cited

U.S. PATENT DOCUMENTS

| | | | |
|---|---|---|---|
| 2005/0276027 A1* | 12/2005 | Shen et al. | 361/753 |
| 2007/0291464 A1* | 12/2007 | Wang | 361/820 |
| 2010/0243301 A1* | 9/2010 | Feng et al. | 174/257 |
| 2012/0074153 A1* | 3/2012 | Yang et al. | 220/694 |
| 2012/0261165 A1* | 10/2012 | Durocher et al. | 174/251 |
| 2012/0281386 A1* | 11/2012 | Kim | 361/818 |
| 2013/0112233 A1* | 5/2013 | Coakley | 136/244 |
| 2013/0284510 A1* | 10/2013 | Lo et al. | 174/377 |

* cited by examiner

A-A'

PRINTED CIRCUIT BOARD GROUNDING STRUCTURE FOR USE WITH COMMUNICATION APPARATUS

CROSS-REFERENCE TO RELATED APPLICATION

This non-provisional application claims priority under 35 U.S.C. §119(a) on Patent Application No(s). 099143260 filed in Taiwan, R.O.C. on Dec. 10, 2010, the entire contents of which are hereby incorporated by reference.

FIELD OF THE TECHNOLOGY

The present invention relates to printed circuit board grounding structures for use with communication apparatuses, and more particularly, to a printed circuit board grounding structure whereby a printed circuit board disposed in a communication apparatus is capable of electromagnetic wave shielding.

BACKGROUND

According to related prior art, a circuit is configured on a printed circuit board in accordance with a circuit layout. Due to the development of high-speed communication technology, electronic components configured on the printed circuit board generate electromagnetic wave in the presence of high-speed data transmission/reception and thus bring about intrinsic electromagnetic interference (EMI) between the electronic components. Upon its occurrence, the aforesaid EMI can be mitigated, by reducing the effect of electromagnetic wave through a specially designed circuit layout and rendering the electronic components free from the EMI which might otherwise take place there between. Still, the electromagnetic wave generated by the electronic components on the printed circuit board in the presence of high-speed data transmission/reception escapes from the printed circuit board and thus interferes with an outside communication apparatus to the detriment of the operation thereof.

To overcome the aforesaid drawback of the prior art, a conventional solution entails providing an electromagnetic wave shielding wall that encloses electromagnetic wave-generating electronic components on a printed circuit board and thus blocks the electromagnetic wave generated by the electronic components, such that external communication apparatuses suffer less EMI from the electronic components. For example, Taiwan published patent application no. 200841812, entitled "Method of Electromagnetic Protection For Circuit board and Components of the Circuit Board," provides a metallic protective device disposed on a circuit board and configured to implement electromagnetic wave shielding.

According to the prior art, it is necessary to provide an additional metallic protective device for use as an electromagnetic protection wall. However, the additional metallic protective device inevitably adds to the costs incurred by the communication apparatus in general. In addition, an examination or an overhaul carried out to electronic components inside the metallic protective device is laborious and expensive, not to mention that the metallic protective device has to be removed before the electronic components inside can be examined or overhauled.

Accordingly, it is imperative to provide a printed circuit board grounding structure for use with a communication apparatus so as to solve the drawbacks of the prior art.

SUMMARY

It is an objective of the present invention to provide a printed circuit board grounding structure for use with a communication apparatus with a view to providing electromagnetic wave shielding for a printed circuit board.

In order to achieve the above and other objectives, the present invention provides a printed circuit board grounding structure for use with a communication apparatus. The printed circuit board grounding structure is configured for use with a printed circuit board to contact a grounded casing and thereby form a grounded circuit capable of electromagnetic wave shielding. The printed circuit board grounding structure comprises a copper conductive layer and a plurality of solder contacts. The copper conductive layer is circumferentially disposed along the periphery of the printed circuit board. The plurality of solder contacts are disposed on the copper conductive layer and used for electrically contacting the casing.

Compared with the prior art, the present invention provides a printed circuit board grounding structure for use with a communication apparatus. The printed circuit board grounding structure is configured to contact a grounded casing, especially a communication apparatus casing. The printed circuit board grounding structure comprises a copper conductive layer circumferentially disposed along the periphery of the printed circuit board, and comprises a plurality of solder contacts disposed on the copper conductive layer. The copper conductive layer, the solder contacts, and the casing in contact therewith form a grounded circuit. In so doing, the printed circuit board is capable of electromagnetic wave shielding. Hence, designed to solve the problems facing the prior art, the grounding structure of the present invention not only eliminates electromagnetic interference generated from inside the printed circuit board, but prevents electromagnetic interference that originates in the printed circuit board from interfering with an outside communication apparatus. Furthermore, the present invention reduces electromagnetic wave shielding deterioration which might otherwise be caused by oxidation of the copper conductive layer.

BRIEF DESCRIPTION OF THE DRAWINGS

To enable persons skilled in the art to fully understand the objectives, features, and advantages of the present invention, the present invention is hereunder illustrated with specific embodiments in conjunction with the accompanying drawings, in which:

FIG. 1b is a cross-sectional view of the printed circuit board grounding structure taken along line A-A' of FIG. 1a;

DETAILED DESCRIPTION

Figure 1A:
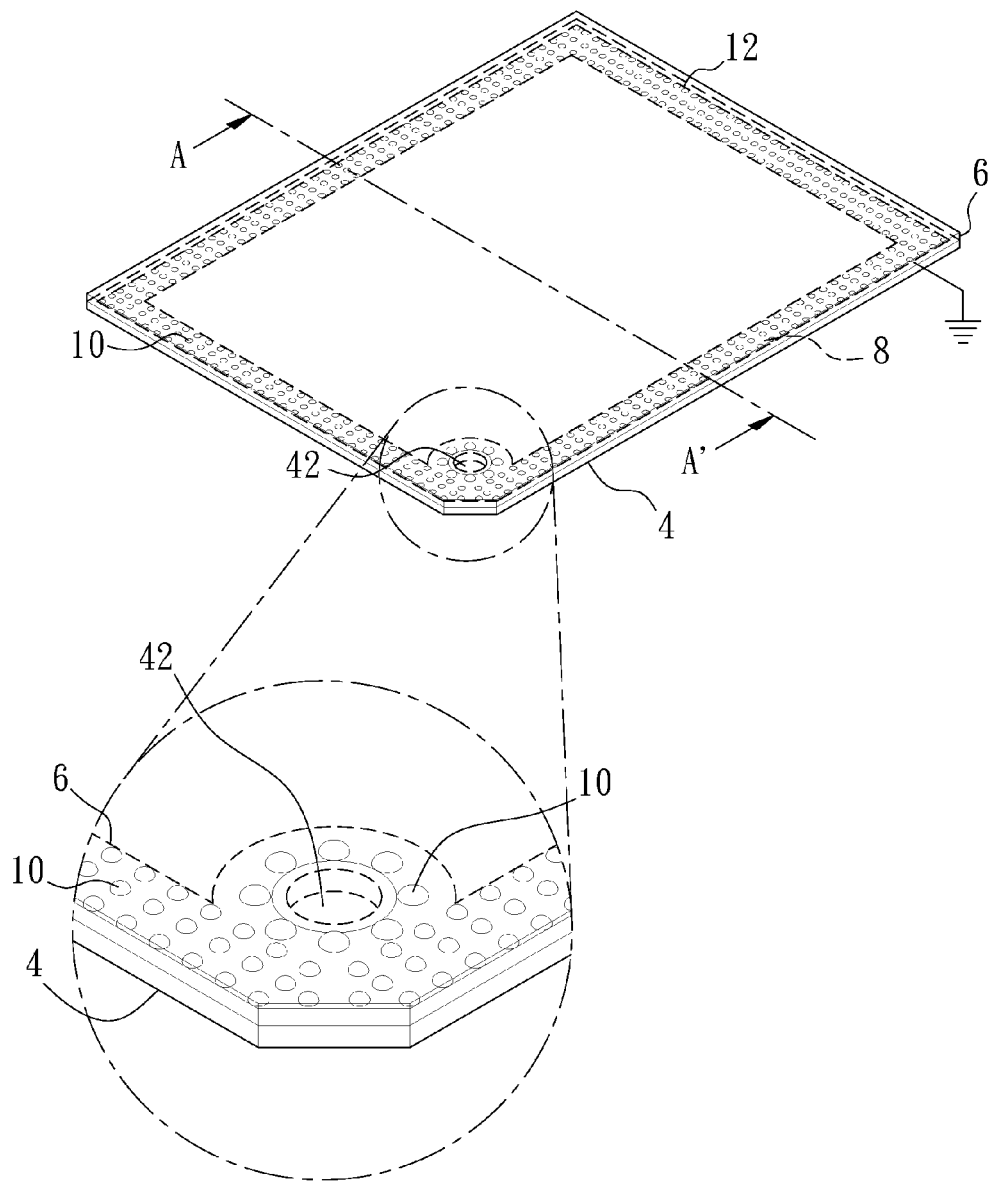
FIG. 1a is a perspective schematic view of a printed circuit board grounding structure for use with a communication apparatus according to a first embodiment of the present invention.
Figure 1B:
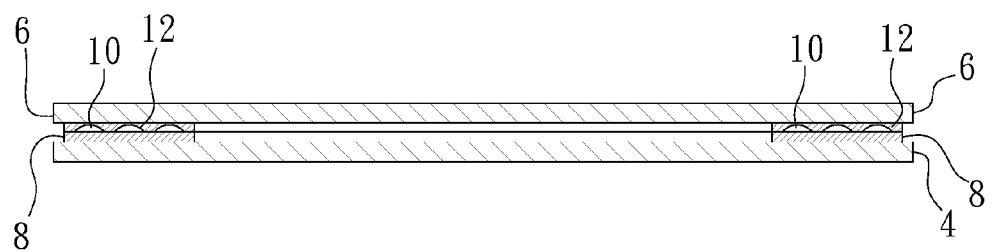

Referring to FIG. 1a and FIG. 1b, there are shown a perspective schematic view and a cross-sectional view of a printed circuit board grounding structure for use with a communication apparatus according to a first embodiment of the present invention, respectively.

Referring to FIG. 1a, a printed circuit board grounding structure 2 is configured for use with a printed circuit board 4 to contact a grounded casing 6 and thereby form a grounded circuit capable of electromagnetic wave shielding. The printed circuit board grounding structure 2 comprises a copper conductive layer 8 and a plurality of solder contacts 10. The copper conductive layer 8 is circumferentially disposed along the periphery of the printed circuit board 4. An opening 42 is disposed in the vicinity of the periphery of the printed circuit board 4 and configured to fix the printed circuit board 4 to the casing 6. Likewise, the opening 42 is circumferentially disposed along the periphery of the copper conductive layer 8. The copper conductive layer 8 circumferentially disposed along the periphery of the printed circuit board 4 forms a low-reductance magnetic flux path along the periphery of the printed circuit board 4. Hence, the low-reductance magnetic flux path functions as a shunt for the electromagnetic wave generated within the margin of the printed circuit board 4, so as to guide the electromagnetic wave or static electricity to the copper conductive layer 8.

Due to their physical properties, namely electrical conductance, the solder contacts 10 are electrically connected to the copper conductive layer 8 when soldered thereto. The solder contacts 10 are disposed on the copper conductive layer 8. Alternatively, the solder contacts 10 are alternately disposed on the copper conductive layer 8. The solder contacts 10 can be of any shape. For example, the solder contacts 10 are each of hemispherical shape and thus protrude from the copper conductive layer 8. Persons skilled in the art should be able to understand that, in the aforesaid embodiment, the solder contacts 10 are densely distributed across the copper conductive layer 8, such that the solder contacts 10 together form a solder contact layer on the copper conductive layer 8. The solder contacts 10 are less susceptible to oxidation to the detriment of physical properties (i.e., electrical conductance) than the copper conductive layer 8 is. Hence, even if the copper conductive layer 8 is oxidized and thus becomes incapable of electrical conductance, electrical conductance will be manifested and maintained by the solder contacts 10 electrically connected to the copper conductive layer 8.

The casing 6 and the solder contacts 10 are coupled together, such that the copper conductive layer 8 can be grounded by coming into contact with the casing 6 through the solder contacts 10, so as to form a grounded circuit capable of electromagnetic wave shielding.

The printed circuit board grounding structure 2 further comprises a soft conductive layer 12 disposed between the casing 6, the copper conductive layer 8 and the solder contacts 10. The soft conductive layer 12 enables the solder contacts 10 and the copper conductive layer 8 to be in tight contact with the casing 6. Hence, the soft conductive layer 12 increases the electrical contact area and thus the electrical conductance of the solder contacts 10 and the copper conductive layer 8. FIG. 1b, which is a cross-sectional view of the printed circuit board grounding structure taken along line A-A' of FIG. 1a, illustrates how the casing 6, the copper conductive layer 8, the solder contacts 10, and the soft conductive layer 12 are coupled to each other.

In another embodiment, it is feasible for the printed circuit board 4 (through the opening 42) to be fixed to the casing 6 by an electrically conductive locking unit, such as a screw. Also, the locking unit enables an opening-adjoining portion of the copper conductive layer 8 to come into contact with the grounded casing 6. Hence, not only is the printed circuit board 4 fixed to the casing 6 by the locking unit, but the copper conductive layer 8 comes into electrical contact with the grounded casing 6 through the locking unit.

Figure 2:
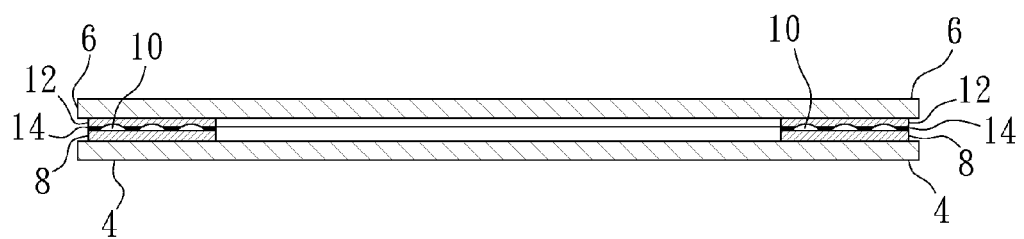
FIG. 2 is a cross-sectional view of a printed circuit board grounding structure for use with a communication apparatus according to a second embodiment of the present invention.

Referring to FIG. 2, there is shown a cross-sectional view of a printed circuit board grounding structure for use with a communication apparatus according to a second embodiment of the present invention. As shown in FIG. 2, a printed circuit board grounding structure 2' is configured for use with the printed circuit board 4 to contact the grounded casing 6 and thereby form a grounded circuit capable of electromagnetic wave shielding, and comprises the copper conductive layer 8 and the solder contacts 10. This embodiment is different from the preceding embodiment in that, in this embodiment, the printed circuit board grounding structure 2' further comprises an organic solderability preservative layer 14. A portion of the copper conductive layer 8 is not provided with the solder contacts 10 but is coated with the organic solderability preservative layer 14; hence, the solder contacts 10 are exposed from the copper conductive layer 8.

The printed circuit board grounding structure 2' further comprises the soft conductive layer 12. The soft conductive layer 12 is disposed between the solder contacts 10 and the organic solderability preservative layer 14. Due to the soft conductive layer 12, the solder contacts 10 and the organic solderability preservative layer 14 are in tight contact with the casing 6 to increase the electrical contact area and electrical conductance thereof.

Figure 3:
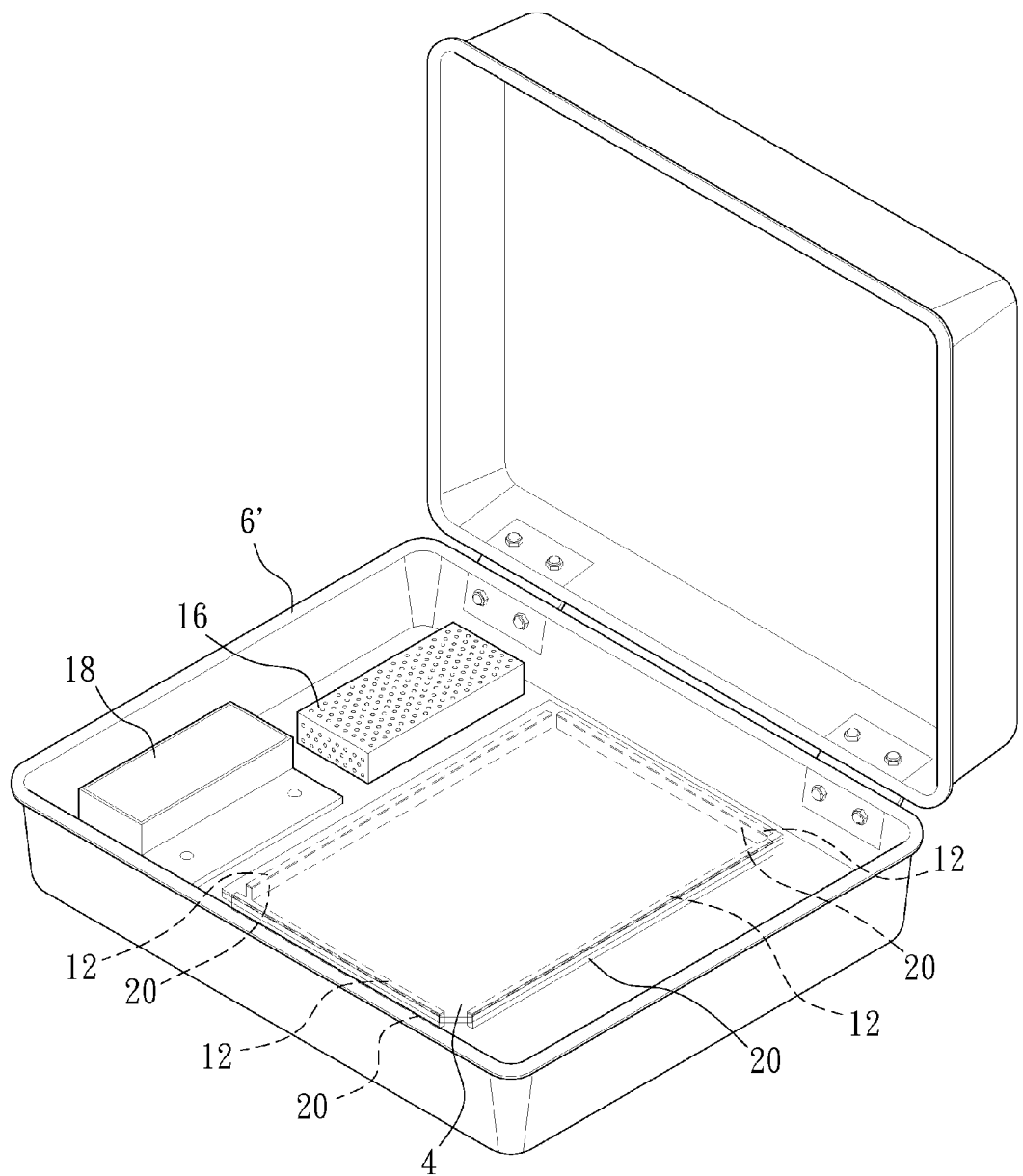
FIG. 3 is a perspective schematic view of a printed circuit board grounding structure coupled to a communication apparatus according to a third embodiment of the present invention.

Referring to FIG. 3, there is shown a perspective schematic view of a printed circuit board grounding structure coupled to a communication apparatus according to a third embodiment of the present invention. As shown in FIG. 3, the printed circuit board 4 equipped with the printed circuit board grounding structures 2, 2' comes into contact with a grounded communication apparatus casing 6'. The communication apparatus casing 6' comprises a power supply unit 16 and an optical transmitting-receiving unit 18. A plurality of ribs 20 are disposed on the inner surface of the communication apparatus casing 6' and covered with the soft conductive layer 12. The inner surface of the ribs 20 faces one side of the printed circuit board 4, such that disposed on the one side of the printed circuit board 4 are the copper conductive layer 8, the solder contacts 10, and/or the organic solderability preservative layer 14. As a result, the copper conductive layer 8, the solder contacts 10, and/or the organic solderability preservative layer 14 are in contact with the soft conductive layer 12, such that the copper conductive layer 8 is electrically connected to the communication apparatus casing 6' through the solder contacts 10 and the soft conductive layer 12, so as to provide a grounded circuit capable of electromagnetic wave shielding with a view to blocking electromagnetic interference arising from inside the printed circuit board 4 or from outside the printed circuit board 4. Hence, the printed circuit board 4 is disposed in the communication apparatus casing 6', and the solder contacts are in electrical contact with the inner surface of the communication apparatus casing 6' so as to provide electromagnetic wave shielding.

Compared with the prior art, the present invention provides a printed circuit board grounding structure for use with a communication apparatus. The printed circuit board grounding structure is configured for use with a printed circuit board to contact a grounded casing, especially a communication apparatus casing. The printed circuit board grounding structure comprises a copper conductive layer circumferentially disposed along the periphery of the printed circuit board, and comprises a plurality of solder contacts disposed on the copper conductive layer. The copper conductive layer, the solder contacts, and the casing in contact with the solder contacts formed a grounded circuit, such that the printed circuit board is capable of electromagnetic wave shielding. Hence, designed to solve the problems facing the prior art, the grounding structure of the present invention not only eliminates electromagnetic interference generated from inside the printed circuit board, but prevents electromagnetic interference that originates in the printed circuit board from interfering with an outside communication apparatus. Furthermore, the present invention reduces electromagnetic wave shielding deterioration which might otherwise be caused by oxidation of the copper conductive layer.

The foregoing embodiments are provided to illustrate and disclose the technical features of the present invention so as to enable persons skilled in the art to understand the disclosure of the present invention and implement the present invention accordingly, and are not intended to be restrictive of the scope of the present invention. Hence, all equivalent modifications and replacements made to the foregoing embodiments without departing from the spirit embodied in the disclosure of the present invention should fall within the scope of the present invention as set forth in the appended claims. Accordingly, the protection for the present invention should be defined by the appended claims.

What is claimed is:

1. A printed circuit board grounding structure for use with a communication apparatus, wherein the printed circuit board grounding structure is configured for use with a printed circuit board to contact a grounded casing and thereby form a grounded circuit capable of electromagnetic wave shielding, the printed circuit board grounding structure comprising:

a copper conductive layer circumferentially disposed along a periphery of the printed circuit board; and a plurality of solder contacts disposed on the copper conductive layer and used for electrically contacting the grounded casing;

wherein the printed circuit board is disposed in the grounded casing that comprises a first case and a second case, allowing the printed circuit board to face the first case of the grounded casing, and the plurality of solder contacts disposed on the printed circuit board are electrically connected to the first case only.

2. The printed circuit board grounding structure of claim 1, wherein the plurality of solder contacts are each of a hemispherical shape.

3. The printed circuit board grounding structure of claim 1, further comprising an organic solderability preservative layer coated on the copper conductive layer and leaving the plurality of solder contacts exposed.

4. The printed circuit board grounding structure of claim 3, further comprising a conductive layer disposed between the plurality of solder contacts, the organic solderability preservative layer, and the grounded casing for electrically connecting the plurality of solder contacts, the copper conductive layer, and the grounded casing.

5. The printed circuit board grounding structure of claim 1, further comprising a conductive layer disposed between the plurality of solder contacts, the copper conductive layer, and the grounded casing for electrically connecting the plurality of solder contacts, the copper conductive layer, and the grounded casing.

\* \* \* \* \*